(12) United States Patent
Choi

(10) Patent No.: US 8,897,075 B2
(45) Date of Patent: Nov. 25, 2014

(54) SEMICONDUCTOR MEMORY DEVICE AND METHOD OF PROGRAMMING THE SAME

(75) Inventor: Jea Won Choi, Gongju-si (KR)

(73) Assignee: SK Hynix Inc., Icheon (KR)

(*) Notice: Subject to any disclaimer, the term of this patent is extended or adjusted under 35 U.S.C. 154(b) by 248 days.

(21) Appl. No.: 13/453,960

(22) Filed: Apr. 23, 2012

(65) Prior Publication Data

US 2012/0287720 A1 Nov. 15, 2012

(30) Foreign Application Priority Data

May 11, 2011 (KR) .................. 10-2011-0044208

(51) Int. Cl.
| | |
|---|---|
| *G11C 16/10* | (2006.01) |
| *G11C 16/04* | (2006.01) |
| *G11C 16/06* | (2006.01) |
| *G11C 16/34* | (2006.01) |

(52) U.S. Cl.
CPC ............ *G11C 16/0483* (2013.01); *G11C 16/10* (2013.01); *G11C 16/3454* (2013.01)
USPC ............. 365/185.19; 365/185.18; 365/185.22

(58) Field of Classification Search
None
See application file for complete search history.

(56) References Cited

U.S. PATENT DOCUMENTS

| | | | | |
|---|---|---|---|---|
| 7,656,710 B1* | 2/2010 | Wong | ................... | 365/185.19 |
| 2005/0083735 A1* | 4/2005 | Chen et al. | ............ | 365/185.17 |
| 2008/0253181 A1 | 10/2008 | Edahiro et al. | | |

FOREIGN PATENT DOCUMENTS

| | | |
|---|---|---|
| KR | 1020080090347 A | 10/2008 |
| KR | 100880329 B1 | 1/2009 |

\* cited by examiner

*Primary Examiner* — James G Norman

(57) ABSTRACT

A semiconductor memory device and a method of programming the same are provided which can improve the program accuracy by classifying cells depending on a program status of memory cells during a program operation to control a bit line program voltage. The method comprises classifying memory cells to be programmed based on program characteristics of the memory cells and sequentially providing word line program voltages having increasing voltage levels and bit line program voltages having decreasing voltage levels to the classified memory cells in a program operation, wherein differently classified two memory cells receive different bit line program voltages, respectively.

19 Claims, 8 Drawing Sheets

SEMICONDUCTOR MEMORY DEVICE AND METHOD OF PROGRAMMING THE SAME

CROSS-REFERENCE TO RELATED APPLICATION

The priority of Korean patent application No. 10-2011-0044208 filed on May 11, 2011 the disclosure of which is hereby incorporated in its entirety by reference, is claimed.

BACKGROUND OF THE INVENTION

Embodiments of the present invention relate to a semiconductor memory device and a method of programming the same, and more particularly to a semiconductor memory device and a method of programming the same, which can improve the program accuracy by adaptively adjusting program voltages of memory cells.

In generally, a semiconductor memory device may be classified into a volatile memory device and a nonvolatile memory device depending on whether stored data is lost or not when a power is not supplied thereto. The nonvolatile memory device includes an Electrically Erasable and Programmable Read Only Memory (EEPROM) device.

BRIEF SUMMARY OF THE INVENTION

Various embodiments of the invention are directed to providing a semiconductor memory device that can improve the program accuracy of memory cells by adjusting program voltages supplied to bit lines and word lines depending on characteristics of each memory cell.

According to an example embodiment of the present invention, a method of programming a semiconductor memory device comprises classifying memory cells to be programmed based on program characteristics of the memory cells, wherein the memory cells are coupled to the selected word line, and sequentially providing word line program voltages having increasing voltage levels and bit line program voltages having decreasing voltage levels which are different to each other with respect to the classified memory cells in a program operation, wherein differently classified two memory cells receive different bit line program voltages, respectively.

The classifying memory cells includes a first step of performing a first program on the memory cells based on an address signal to classify the memory cells where the first program is performed into first to third status cells.

The sequentially providing of the word line and the bit line program voltages comprises a second step of applying first to third word line program voltages whose voltage levels sequentially increase through the selected word line, a third step of providing a first bit line program voltage to the first status cell while the first to third word line program voltages are applied, a fourth step of providing the first bit line program voltage to the second status cell while the first word line program voltage is applied and a second bit line program voltage to the second status cells while the second and third word line program voltages are applied, and a fifth step of providing the first bit line program voltage to the third status cell while the first word line program voltage is applied, the second bit line program voltage to the third status cell while the second word line program voltage is applied and a third bit line program voltage to the third status cell while the third word line program voltage is applied.

The first to third status cells respectively correspond to a fast cell, a typical cell and a slow cell.

The classifying of the memory cells into the first to third status cells comprises applying a program word line voltage having a predetermined voltage level to the memory cells to be programmed to perform the first program, and classifying the memory cells where the first program is performed into the first to third status cells based on first and second classifying verification voltages.

The second to fifth steps constitute one program loop and the method further comprises, performing a verification operation on the memory cells after the one program loop is completed based on first to third verification voltages to reclassify the first to third status cells.

The method further comprises repeating the program loop as increasing voltage levels of the first to third word line program voltages until all of the memory cells are determined passed memory cells where a program is completed.

The first word line program voltage used in a current program loop has a greater voltage level than the third word line program voltage used in a previous program loop.

The method further comprises providing a program inhibition voltage through a bit line to a memory cell determined as a passed memory cell by a verification result while a next program loop is performed.

The classifying of the memory cells into the first to third status cells comprises storing the address signal of the memory cells and the statuses of the cells.

Voltage levels of the first to third bit line program voltages become smaller sequentially.

According to an example embodiment of the present invention, a semiconductor memory device comprises a memory cell array, a program control unit, a voltage generator, a row decoder, and a column decoder. The memory cell array includes memory cells to be programmed, which are coupled to a selected word line. The program control unit classifies statuses of the memory cells and generates a row voltage control signal and a column voltage control signal. The voltage generator generates word line program voltages and bit line program voltages. The row decoder provides the word line program voltages whose voltage levels sequentially increase in one program loop to the selected word line in response to the row voltage control signal. The column decoder provides the bit line program voltages whose voltage levels are different depending on the statuses of the memory cells to bit lines coupled to the memory cells in response to the column voltage control signal.

The program control unit comprises a verification circuit verifies a program result on the memory cells to generate a verification signal, a program control circuit classifies the statuses of the memory cells based on the verification signal to generate the row voltage control signal and the column voltage control signal, and a cell status storage circuit stores addresses of the memory cells and the classified statuses of the memory cells.

The memory cells are classified into a fast cell, a typical cell and a slow cell. While the word line program voltages are applied to the selected word line in response to the row voltage control signal, the column decoder provides, in response to the column voltage control signal, a first bit line program voltage to the fast cell, the first and second bit line program voltages to the typical cell, and the first to third bit line program voltages to the slow cell.

The row decoder provides first to third word line program voltages which sequentially increase in each program loop in response to the row voltage control signal. For example, the first bit line program voltage, the second bit line program voltage following the first bit line program voltage, and the third bit line program voltage following the second bit line program voltage have sequentially decreasing values.

According to an example embodiment of the present invention, a method of programming a semiconductor memory device comprises providing a memory cell in a memory cell array, the memory cell being coupled to a word line and a bit line, applying a set of word line program voltages to the word line to program the memory cell, and applying a set of bit line voltages to the bit line to program the memory cell while the set of word line program voltages is being applied to the word line, wherein the applied set of bit line voltages is selected from at least first, second, and third sets based on a program characteristic of the memory cell.

The first set of bit line voltages includes first, second, and third voltages that are different from each other, the second set of bit line voltages includes only the first voltage and the second voltage, and the third set of the bit line voltages includes only the second voltage, the first voltage is the highest potential of the three, the second voltage has an intermediate potential of the three, and the third voltage is the lowest potential of the three.

The memory cell is part of a string of memory cells in the memory cell array, and the set of word line program voltages includes at least three voltage pulses that progressively increases.

The set of program word line voltages includes at least three voltage pulses that progressively increase with time, and the set of bit line voltages includes at least three voltage pulses that progressively decreases with time.

DESCRIPTION OF EMBODIMENTS

Embodiments of the present invention will be described in detail with reference to the attached drawings.

A flash memory device is configured to perform a program operation of writing data in memory cells, a read operation of reading the written data, and an erase operation of erasing the written data. The erase operation of the flash memory device may be performed by a block or sector unit. Also, according to a structure of a memory cell array, the flash memory device may be classified into a NAND type flash memory device where cell transistors are arranged in series and a NOR type flash memory device where cell transistors are arranged in parallel between a bit line and a ground voltage terminal. In comparison with the NOR type flash memory device, the NAND type flash memory device may perform program and erase operations at high speed although it is difficult to access data by a byte unit in read and program operations.

Figure 1:
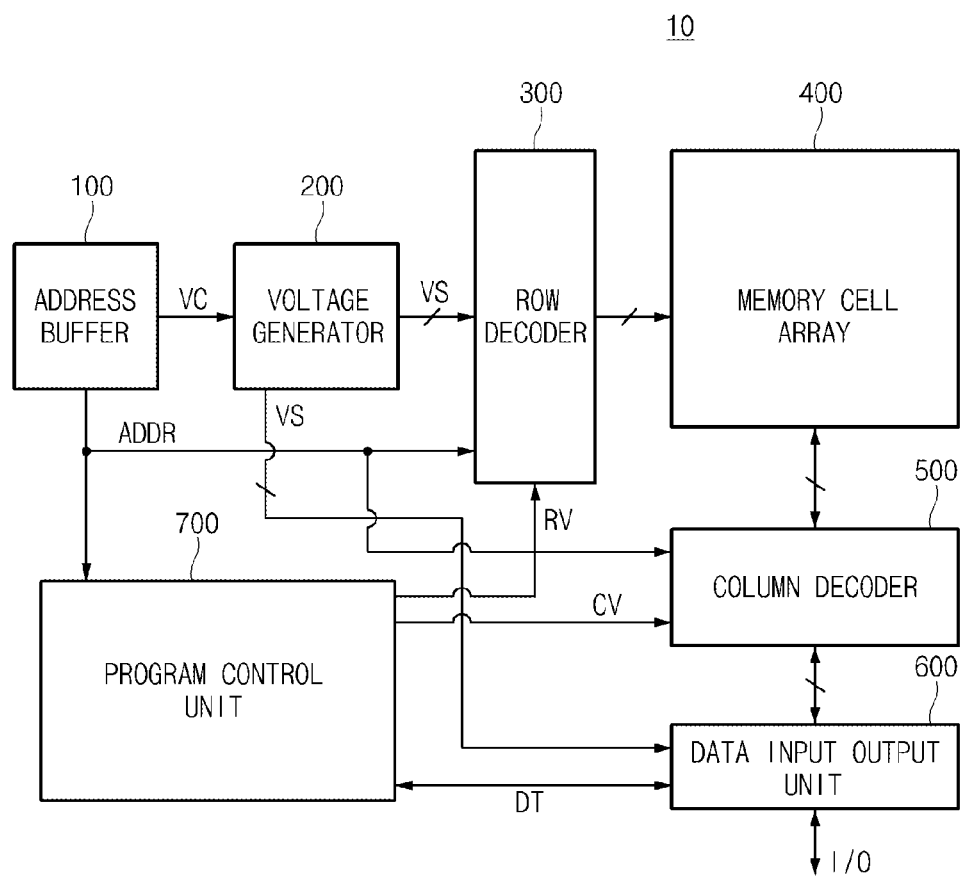
FIG. 1 illustrates a block diagram of a semiconductor memory device according to an embodiment of the present invention.

FIG. 1 illustrates a block diagram of a semiconductor memory device according to an embodiment of the present invention.

Referring to FIG. 1, the semiconductor memory device 10 includes an address buffer 100, a voltage generator 200, a row decoder 300, a memory cell array 400, a column decoder 500, a data input output (I/O) unit 600, and a program control unit 700.

The address buffer 100 receives an address signal ADDR from an external device such as a host or a control unit (not shown) of the semiconductor memory device to provide the address signal ADDR to the row decoder 300, the column decoder 500, and the program control unit 700.

The voltage generator 200 generates a word line program voltage Vpgm and a bit line program voltage Vb based on a voltage control signal VC provided from the address buffer 100. The word line program voltage Vpgm may increase by ΔVpgm in each program loop. Also, in an embodiment of the present invention, the word line program voltage Vpgm may be a step pulse that increases sequentially in one program loop.

Similar to an incremental step pulse program (ISPP), the word line program voltage Vpgm increases in each program loop. However, the word line program voltage Vpgm according to an embodiment of the present invention may sequentially increase in one program loop. For example, the word line program voltage Vpgm in one program loop may have voltage levels that increase in three stages.

In this embodiment of the present invention, a voltage supplied to a bit line is adjusted depending on the word line program voltage Vpgm increasing in three stages and statuses of memory cells, so that a voltage where a channel of each memory cell is formed may be differently provided to the memory cells.

The bit line program voltage Vb may include first to third bit line program voltages Vb1, Vb2 and Vb3. For example, the first to third bit line program voltages Vb1, Vb2 and Vb3 may have sequentially decreasing values, respectively.

The semiconductor memory device 10 classifies memory cells where a program operation is to be performed into first to third status cells to provide the first to third status cells with the different bit line program voltages Vb1, Vb2 and Vb3 while programming each memory cell.

The word line program voltage Vpgm generated from the voltage generator 200 may be supplied to the memory cell array 400 through the row decoder 300.

In the semiconductor memory device 10, a program unit may be comprised of pages or sectors. The word line program voltage Vpgm may be supplied to a selected word line, and a pass voltage Vpass may be supplied to the non-selected word lines.

The row decoder 300 provides first to third word line program voltages Vpgm1, Vpgm2 and Vpgm3 that sequentially increase through the selected word line in response to a row voltage control signal RV. A voltage level of each of the word line program voltages Vpgm1, Vpgm2 and Vpgm3 provided during one program loop may increase during the next program loop. According to an embodiment of the present invention, the first word line program voltage Vpgm1 having the smallest voltage level in a corresponding program loop may have a voltage level increased by ΔVpgm from the third word line program voltage Vpgm3 having the largest voltage level in a previous program loop. The word line program voltage Vpgm may be supplied to the memory cell array 400 with a pulse type through the row decoder 300.

Since non-selected memory cells connected to the selected word line are not programmed or a program completion time of each memory cell may be different although the same word line program voltage Vpgm is applied to all of the memory cells connected to the selected word line, a different bit line program voltage Vb is supplied through a bit line connected to each memory cell to control a program operation.

The memory cell array 400 including a plurality of memory cells coupled between word lines and bit lines stores data and outputs written data based on voltages supplied to the word lines and the bit lines.

According to an embodiment of the present invention, the plurality of memory cells included in the memory cell array 400 may be flash memory cells, each of which stores data based on voltage levels applied to a gate and first and second terminals of a memory cell transistor by a phenomenon that electrons are implanted into a floating gate by a Fowler Nordheim (FN) tunneling effect to differentiate a threshold voltage.

The data I/O unit 600 selects one of bit line program voltages Vb based on data DT to supply the selected bit line program voltage Vb to the column decoder 500. The column decoder 500 supplies the received bit line program voltage Vb to memory cells included in the memory cell array 400 through a corresponding bit line. However, according to an embodiment of the present invention, the bit line program voltage Vb may be directly supplied to the column decoder 500 and provided to the memory cell array 400 without passing through the data I/O unit 600.

The data I/O unit 600 receives data from the memory cell array 400 through selected bit lines during a read operation of the semiconductor memory device 10, and outputs the data to the exterior or provides a verification voltage for the selected word line in the similar way to the read operation during a verification operation included in the program operation to read the data, thereby supplying the received data as a sense signal to the program control unit 700.

The program control unit 700 performs a first program on memory cells where a program operation is supposed to be performed, classifies the memory cells where the program operation is performed into the first to third status cells based on the performed first program result and generates a column voltage control signal CV, so that the column decoder 500 may supply the bit line program voltages Vb1, Vb2 and Vb3 differently to the first to third status cells.

According to an embodiment of the present invention, the program control unit 700 generates the row voltage control signal RV, thereby supplying the word line program voltage Vpgm suitable for the program operation through the word lines coupled to the memory cell array 400.

The detailed operation of the program control unit 700 will be described below referring to FIG. 7.

Figure 2:
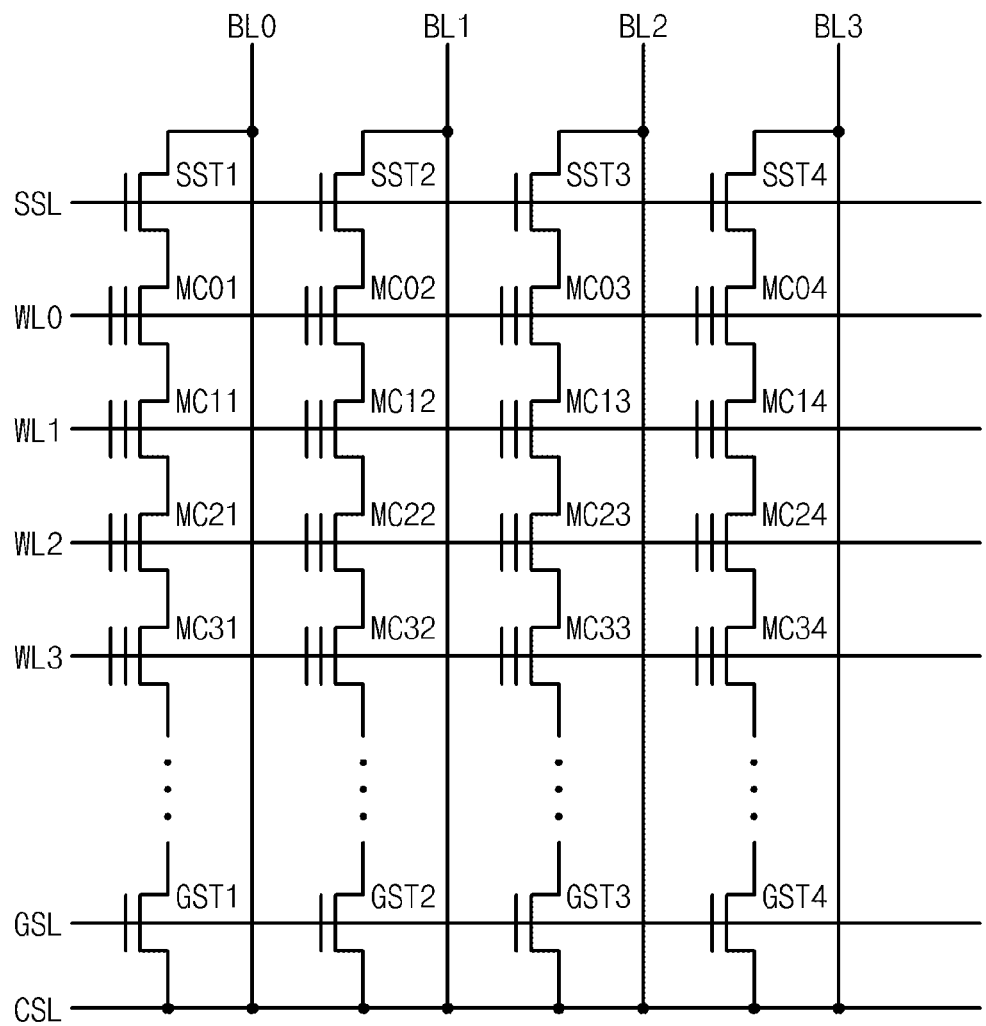
FIG. 2 illustrates a memory cell array according to an embodiment of the present invention.

FIG. 2 illustrates a structure of a part of the memory cell array 400 according to an embodiment of the present invention.

Referring to FIG. 2, the memory cell array 400 includes first to fourth bit lines BL0, BL1, BL2 and BL3, first to fourth word lines WL0, WL1, WL2 and WL3, a string selection line SSL, a ground selection line GSL, a common source line CSL, and a plurality of memory cells MC.

In one cell string coupled to one bit line, e.g., BL0, a ground selection transistor GST, e.g., GST1, a plurality of memory cells, e.g., MC01 to MC31, and a string selection transistor SST, e.g., SST1, are connected in series. The ground selection transistor GST, e.g., GST1, is coupled to the common source line CSL and the string selection transistor SST, e.g., SST1, is coupled to the bit line BL, e.g., BL0.

Figure 3A:
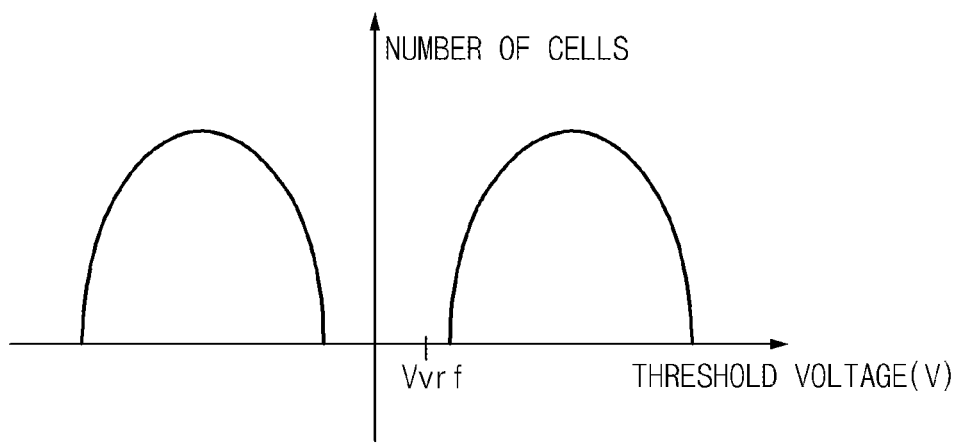
FIG. 3a illustrates cell distribution according to cell programming.
Figure 3B:
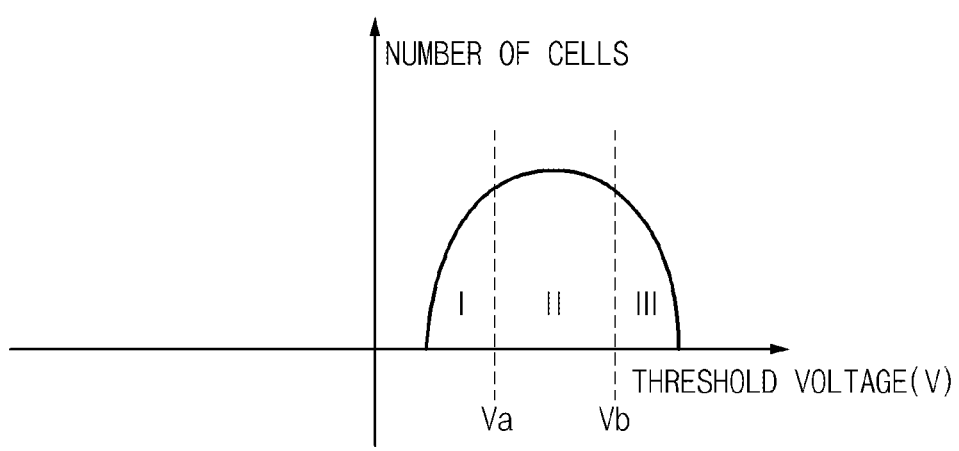
FIG. 3b illustrates a standard to classify statuses of memory cells while performing a program operation in a semiconductor memory device according to an embodiment of the present invention.

FIG. 3a illustrates the cell distribution according to cell programming, and FIG. 3b illustrates a standard to classify statuses of memory cells while performing a program operation in a semiconductor memory device according to an embodiment of the present invention.

In FIGS. 3a and 3b, an axis X represents a threshold voltage of the memory cells, and an axis Y represents the number of the memory cells having a certain threshold voltage.

Referring to FIG. 3a, the memory cells may have two statuses depending on program conditions. The two statuses of the memory cells include an erasure status E having a threshold voltage with a negative value and a program status P having a threshold voltage with a positive value. Before the program operation is performed, all memory cells included in the memory cell array 400 may release all electrons that remain in each floating gate through a bulk erasure and have the erasure status E. According to an embodiment of the present invention, the erasure status E and the program status P may respectively correspond to data '0' and '1'.

In order to determine whether a memory cell where the program operation is supposed to be performed has the program status P or not, a verification voltage Vvrf may be used. If the memory cell has a threshold voltage that is higher than the verification voltage Vvrf, the memory cell is determined as having the program status P.

However, it may take a considerable time to program a plurality of memory cells to have a threshold voltage that is higher than the verification voltage Vvrf. As shown in FIG. 3a, since the memory cells have the Gaussian distribution in each of the erasure status E and the program status P, there is a deviation between a program performance time of memory cells distributed in the edge and a program performance time of average memory cells distributed around a center of the Gaussian distribution.

In the method of programming the semiconductor memory device according to the embodiment of the present invention, the word line program voltage Vpgm having a predetermined voltage level is applied to the memory cells that are in the erasure status E so that a first program may be performed on the memory cells.

FIG. 3b shows the distribution of the memory cells after the first program is performed. Based on first and second classifying verification voltages Va and Vb, memory cells corresponding to a third region III may be classified as a first status cell, memory cells corresponding to a second region II may be classified as a second status cell, and memory cells corresponding to a first region I may be classified as a third status cell. According to an embodiment of the present invention, the first status cell may be represented as a fast cell where the program operation is performed in a high speed, the second status cell may be represented as a typical cell where program operation is performed in a normal speed, and the third status cell may be represented as a slow cell where the program operation is perform in a low speed.

Since an expected program time of each memory cell is predicted based on the threshold voltage distribution of the memory cells where the first program is performed, different bit line program voltages may be supplied to the first to third status cells in a subsequent program.

Figure 4A:
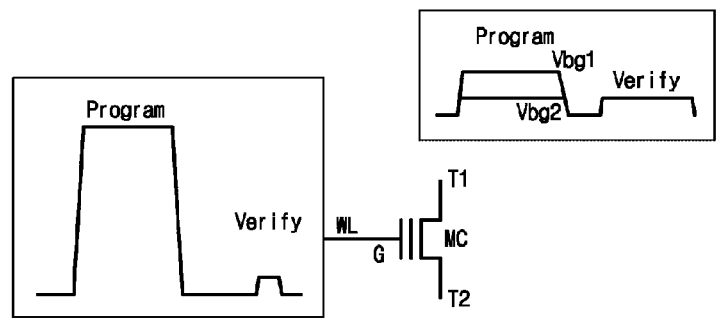
FIG. 4a illustrates program voltages applied to a memory cell in a program operation.
Figure 4B:
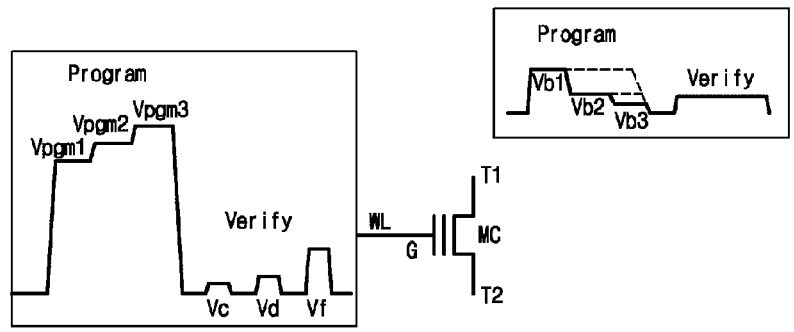
FIG. 4b illustrates program voltages applied to a memory cell in a program operation of a semiconductor memory device according to an embodiment of the present invention.

FIG. 4a illustrates program voltages applied to a memory cell in a program operation, and FIG. 4b illustrates program voltages applied to a memory cell in a program operation of a semiconductor memory device according to an embodiment of the present invention.

In FIGS. 4a and 4b, a first terminal T1 and a second terminal T2 of each memory cell MC are a drain and a source, respectively, or vice versa. The memory cell MC includes a gate G coupled to a word line WL.

As described above, the plurality of memory cells included in the memory cell array 400 stores electrical charges in their floating gates to have different threshold voltages. The threshold voltage may be determined depending on a length of a channel based on voltages applied to the gate and the drain.

Referring to FIG. 4a, a word line program voltage Vpgm having a predetermined value is provided to the word line WL, and voltages having two levels of a first set bit line voltage Vbg1 and a second set bit line voltage Vbg2 are provided through the first terminal T1 coupled to a bit line BL while the word line program voltage Vpgm is provided to the word line WL.

In this case, a voltage having two statuses may be applied to between the gate and the drain in the memory cell MC where the program operation is to be performed, and a verification operation is performed to complete one program loop.

In the program method shown in FIG. 4a, while the program loop is performed, a method of increasing or decreasing the speed of the program operation on the memory cell MC is used. As a result, it is difficult to predict a program completion time, so that the program accuracy is difficult to obtain.

Referring to FIG. 4b, first to third word line program voltages Vpgm1, Vpgm2 and Vpgm3 which sequentially increase are applied through the word line WL. While the first to third word line program voltages Vpgm1, Vpgm2 and Vpgm3 are applied to the word line WL, a bit line voltage applied to the bit line BL may be maintained at the first bit line program voltage Vb1, or may be applied with the first bit line program voltage Vb1 and then decreased to the second bit line program voltage Vb2, or may be applied with the first bit line program voltage Vb1, decreased to the second bit line program voltage Vb2 and then further decreased to the third bit line program voltage Vb3.

When the program operation is performed as shown in FIG. 4b, a channel length of the memory cell MC may be controlled by any of voltages of Vpgm1-Vb1, Vpgm1-Vb2, Vpgm1-Vb3, Vpgm2-Vb1, Vpgm2-Vb2, Vpgm2-Vb3, Vpgm3-Vb1, Vpgm3-Vb2, and Vpgm3-Vb3, so that it is possible to finely control a voltage implanted into a floating gate of the memory cell MC.

For example, although the same voltage difference is generated between the drain and the gate, in case of the third status cell (slow cell) having a large amount of electrons implanted into the floating gate, the program operation may be performed smoothly even with a voltage difference between the drain and the gate smaller than that of the first status cell. In detail, the first status cell and the third status cell may have different sensitivity for implanting the electrons into the floating gate with respect to the same voltage difference between the drain and the gate, which are the bit line and the word line, respectively.

Since the word line WL is commonly coupled to a plurality of memory cells where the program operation is performed, it is difficult to apply the word line program voltage Vpgm differently to the memory cells depending on the cell status. In this regard, a sequentially decreasing bit line program voltage is applied to the third status cell that is a slow cell, and a bit line program voltage having a constant value is supplied to the first status cell that is a fast cell. A bit line program voltage, which corresponds to a medium degree of that of the first status cell and that of the third status cell, may be applied to the second status cell that is a typical cell.

Also, in each program loop, the statuses of the memory cells are classified based on the different verification voltages to control the program condition of each memory cell and to shorten a program time.

A method of programming a semiconductor memory device according to an embodiment of the present invention will be described in more detail with reference to FIGS. 5 and 6.

Figure 5:
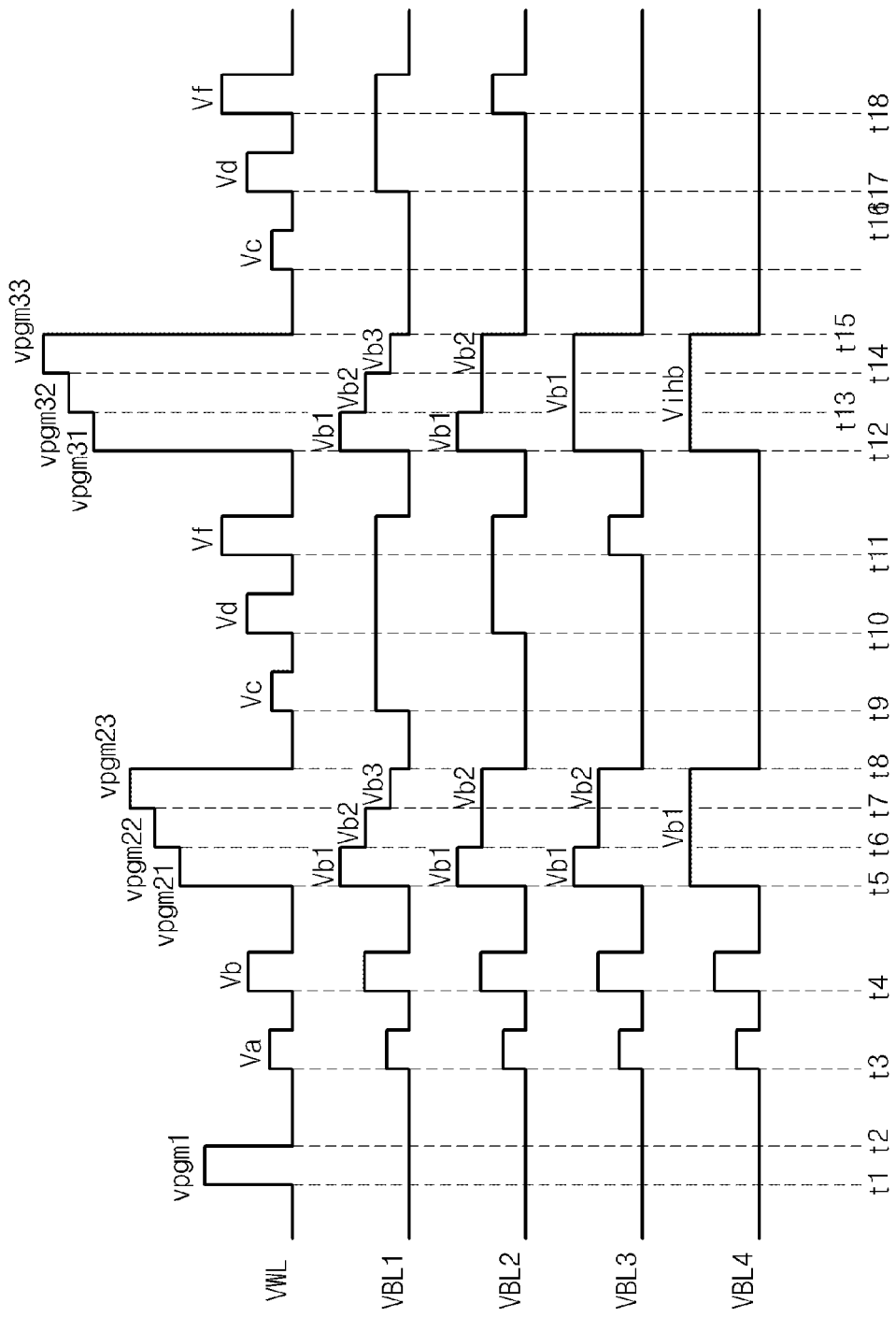
FIG. 5 illustrates voltages supplied to a word line and a bit line of a memory cell array according to an embodiment of the present invention.
Figure 6:
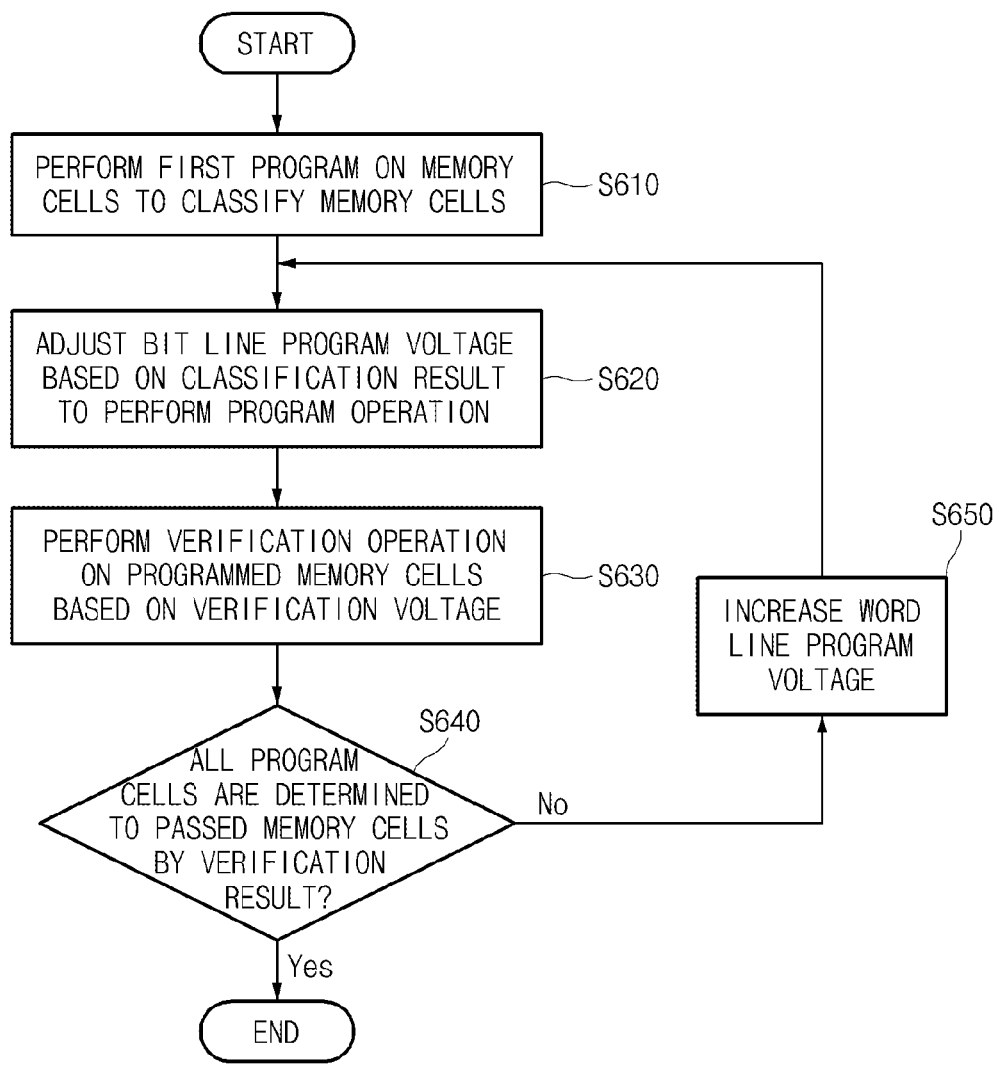
FIG. 6 is a flow chart illustrating a method of programming a semiconductor memory device according to an embodiment of the present invention.

FIG. 5 illustrates voltages supplied to the word line WL and the bit line BL of the memory cell array 400, and FIG. 6 is a flow chart illustrating a method of programming a semiconductor memory device according to an embodiment of the present invention.

Referring to FIG. 5, 'VWL' represents a voltage level applied to the selected word line, and 'VBL1', 'VBL2', 'VBL3', and 'VBL4' represent voltage levels applied to the first to fourth bit lines BL0, BL1, BL2, and BL3 of FIG. 2, respectively. Hereinafter, a case the second word line WL1 is selected to program memory cells MC11, MC12, MC13, and MC14 in FIG. 2 is described.

A first program is performed on the memory cells MC11, MC12, MC13, and MC14 included in the memory cell array 400 so that the memory cells MC11, MC12, MC13, and MC14 are classified into the first to third status cells at step S610. From a point of time t1 to a point of time t2, a word line program voltage Vpgm1 having a predetermined voltage level is applied through the second word line WL1.

The first and second classifying verification voltages Va and Vb are applied to each memory cell to sense whether the memory cell is turned on or not, thereby classifying the memory cell into one of the first to third status cells. A period of performing the first program is from the point of time t1 to a point of time t5.

For example, as a result of the first program, the memory cell MC11 is classified as the third status cell, the memory cells MC12 and MC13 are classified as the second status cell, and the memory cell MC14 is classified as the first status cell.

From the point of time t5 to a point of time t6, a first word line program voltage Vpgm21 is applied to the second word line WL1. The first word line program voltage Vpgm21 may have a voltage level greater than that of the word line program voltage Vpgm1 supplied to the second word line WL1 while the first program is performed.

The first word line program voltage Vpgm21 may be supplied to the second word line WL1 by a switching operation performed by the row decoder 300 that receives the first word line program voltage Vpgm21 generated from the voltage generator 200 of FIG. 1 in response to the row voltage control signal RV supplied from the program control unit 700.

While the first word line program voltage Vpgm21 is supplied to the second word line WL1, the first bit line program voltage Vb1 is supplied to the memory cells to be programmed regardless of classification of the memory cells such as the first to third status cells.

From the point of time t6 to a point of time t7, a second word line program voltage Vpgm22 having a voltage level greater than that of the first word line program voltage Vpgm21 is applied to the second word line WL1. During this period, the second bit line program voltage Vb2 smaller than the first bit line program voltage Vb1 is supplied to the memory cells MC11, MC12 and MC13, which are the second and third status cells, and the first bit line program voltage Vb1 is maintained in the memory cell MC14 that is the first status cell. As a result, a relatively great voltage difference is generated in the second and third status cells than in the first status cell so that an amount of electrons implanted into a floating gate of the second or third status cell becomes greater.

From the point of time t7 to a point of time t8, a third word line program voltage Vpgm23 having a voltage level greater than that of the second word line program voltage Vpgm22 is applied to the second word line WL1. The same bit line program voltages Vb1 and Vb2 are respectively applied to the first and second status cells, i.e., the memory cells MC12, MC13, and MC14, through the second to fourth bit lines BL1, BL2 and BL3. The third bit line program voltage Vb3 smaller than the second bit line program voltage Vb2 is applied to the third status cell, i.e., the memory cell MC11. As a result, the largest voltage difference may be applied to the third status cell, i.e., the memory cell MC11, that is a slow cell at step S620.

After the program operation is performed by adjusting the program voltage applied to the bit line based on the status classification result of the memory cells, a verification operation is performed on the programmed memory cells at step S630.

The verification operation may be performed based on first to third verification voltages Vc, Vd, and Vf. The first to third verification voltages Vc, Vd, and Vf may have different values from the first and second classifying verification voltages Va and Vb that were used in the first program to classify the memory cells.

During the verification operation, when a voltage greater than a threshold voltage is applied to the word line coupled to each memory cell, the memory cell is turned on to supply a consistent voltage to the bit line.

Based on the first to third verification voltages Vc, Vd, and Vf, it is determined that the memory cells are passed or failed while the first to third status cells are re-classified. That is, when the first to third verification voltages Vc, Vd, and Vf are applied to the second word line WL1, the memory cell MC11 coupled to the first bit line BL0 is all turned on and thus it is re-classified as the third status cell. When the first verification voltage Vc is applied to the second word line WL1, the memory cell MC12 coupled to the second bit line BL1 is turned off to have a greater threshold voltage than the first verification voltage Vc. However, when the second and third verification voltages Vd and Vf are applied to the second word line WL1, the memory cell MC12 is turned on to have a threshold voltage between the first verification voltage Vc and the second verification voltage Vd, so that the memory cell MC12 is re-classified as the second status cell.

The memory cell MC13 coupled to the third bit line BL2 is turned off when the first and second verification voltages Vc and Vd are applied to the second word line WL1, but it is turned on to have a threshold voltage between the second and third verification voltages Vd and Vf when the third verification voltage Vf is applied to the second word line WL1, so that the memory cell MC13 is re-classified as the first status cell.

The memory cell MC14 coupled to the fourth bit line BL3 is turned off when the first to third verification voltages Vc, Vd, and Vf are applied to the second word line WL1, so that the memory cell MC14 is considered to be the passed memory cell. Thus, in a subsequent program operation, a program inhibition voltage Vinb is applied to the fourth bit line BL3.

According to an embodiment of the present invention, each of the verification voltages Vc, Vd, and Vf may be adjusted to have a different value depending on program loops, and the verification voltages Vc, Vd, and Vf may be generated from the voltage generator 200 controlled by the program control unit 700 to be supplied to the word lines of the memory cell array 400.

The verification operation is performed to supply the verification voltages to the memory cell array 400 through the row decoder 300, so that the sense signal may be supplied to the program control unit 700 through the column decoder 500 and the data I/O unit 600. During the verification operation, the program control unit 700 stores the addresses and re-classified statuses of the memory cells.

As a result of the verification operation, if all the memory cells to be programmed are determined as passed memory cells at step S640, the entire program operation is terminated.

As a result of the verification operation, if at least one of the memory cells to be programmed is determined as a failed memory cell at step S640, the word line program voltage Vpgm increases at step S650, and the program loop is performed again.

Since at least one of the memory cells to be programmed is determined as a failed memory cell, the next program loop starts from a point of time t12.

From the point of time t12 to a point of time t15, first to third word line program voltages Vpgm31, Vpgm32, and Vpgm33, which sequentially increase, are supplied to the second word line WL1, the first to third bit line program voltages Vb1, Vb2, and Vb3, which sequentially decrease, are supplied through the first bit line BL0 coupled to the memory cell MC11 classified as the third status cell, and the first and second bit line program voltages Vb1 and Vb2 are supplied through the second bit line BL1 coupled to the memory cell MC12 classified as the second status cell.

Through the third bit line BL2 coupled to MC13 classified as the first status cell, the first bit line program voltage Vb1 is supplied with a consistent value. The program inhibition voltage Vinb is supplied to the fourth bit line BL3 coupled to the memory cell MC14 that is determined as the passed memory cell.

The first to third word line program voltages Vpgm31, Vpgm32, and Vpgm33 may have increased values than the third word line program voltage Vpgm23. Thus, it is easy to control an increase width of the program voltages in the method of programming the semiconductor memory device according to the embodiment of the present invention. For example, it is possible to finely control the distribution of the threshold voltages by adjusting a voltage difference between the word line and the bit line to be greater when the memory cell is classified as a slow cell so as to increase a threshold voltage of the memory cell rapidly and by regulating the voltage difference between the word line and the bit line to be smaller when the memory cell is classified as a fast cell according to the program loop.

Figure 7:
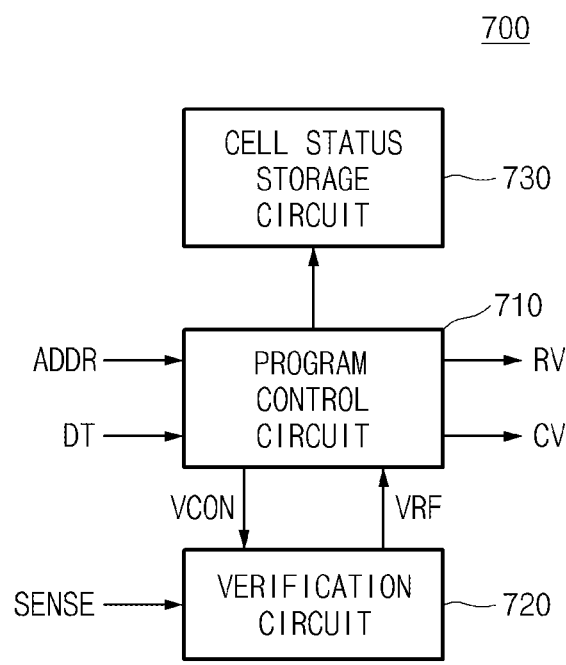
FIG. 7 illustrates a block diagram of a program control unit in FIG. 1 according to an embodiment of the present invention.

FIG. 7 illustrates a block diagram of the program control unit 700 in FIG. 1 according to an embodiment of the present invention.

Referring to FIG. 7, the program control unit 700 includes a program control circuit 710, a verification circuit 720 and a cell status storage circuit 730.

The program control circuit 710 receives the address signal ADDR and a data signal DT to write specific data. According to an embodiment of the present invention, the program control circuit 710 may receive a verification signal VRF to classify the statuses of the memory cells where the program operation is supposed to be performed and provide the column decoder 500 with the column voltage control signal CV to supply a bit line program voltage having a different voltage level depending on the statuses of the memory cells. Also, the program control circuit 710 may provide the row decoder 300 with the row voltage control signal RV to supply a word line program voltage having a voltage level increasing according to the process of the program loop.

The program control circuit 710 may provide the verification circuit 720 with a verification control signal VCON so as to supply a verification voltage having a different voltage level depending on a verification result.

Additionally, the program control circuit 710 stores the addresses and statuses of the memory cells where the program operation is performed in the cell status storage circuit 730. The statuses of the memory cells stored in the cell status storage circuit 730 may be renewed in real time because each status is continuously re-classified as the program loop is progressed.

Thus, the program control unit 700 employed in the semiconductor memory device according to the embodiment of the present invention classifies the statuses of the memory cells to be programmed to control the word line program voltage Vpgm and the bit line program voltage Vb supplied to each memory cell.

According to the embodiment of the present invention, the word line program voltage Vpgm may sequentially increase by the number of the classified statuses of the memory cells in one program loop, and the bit line program voltage Vb may be supplied with different voltage levels by the number of the classified statuses of the memory cells. For example, the bit line program voltage Vb may sequentially decrease on the contrary to the word line program voltage Vpgm, or may have a consistent value. The bit line program voltage Vb is adjusted to have a different voltage level depending on the classified statuses of the memory cells, so that the voltage difference between the bit line and the word line supplied to each memory cell may change depending on the statuses of the memory cells even in a single program loop.

As a result, a great voltage difference is applied to between a drain and a gate of a memory cell that is supposed to have a relatively low threshold voltage and thus that need a much time to complete a program operation in the process of the program loop, so that electron implantation into a floating gate of the memory cell is accelerated. However, as the memory cell has a threshold voltage close to a program threshold voltage where the memory cell can be programmed, the word line program voltage Vpgm and the bit line program voltage Vb is adjusted to have a small voltage difference therebetween, thereby adjusting an amount of electrons implanted into the floating gate to be smaller.

Thus, the method of programming the semiconductor memory device according to the embodiment of the present invention can improve the accuracy of the program operation and the distribution of the threshold voltages of the memory cells, so that the method may be useful in semiconductor memory devices for storing data of multiple values.

Figure 8:
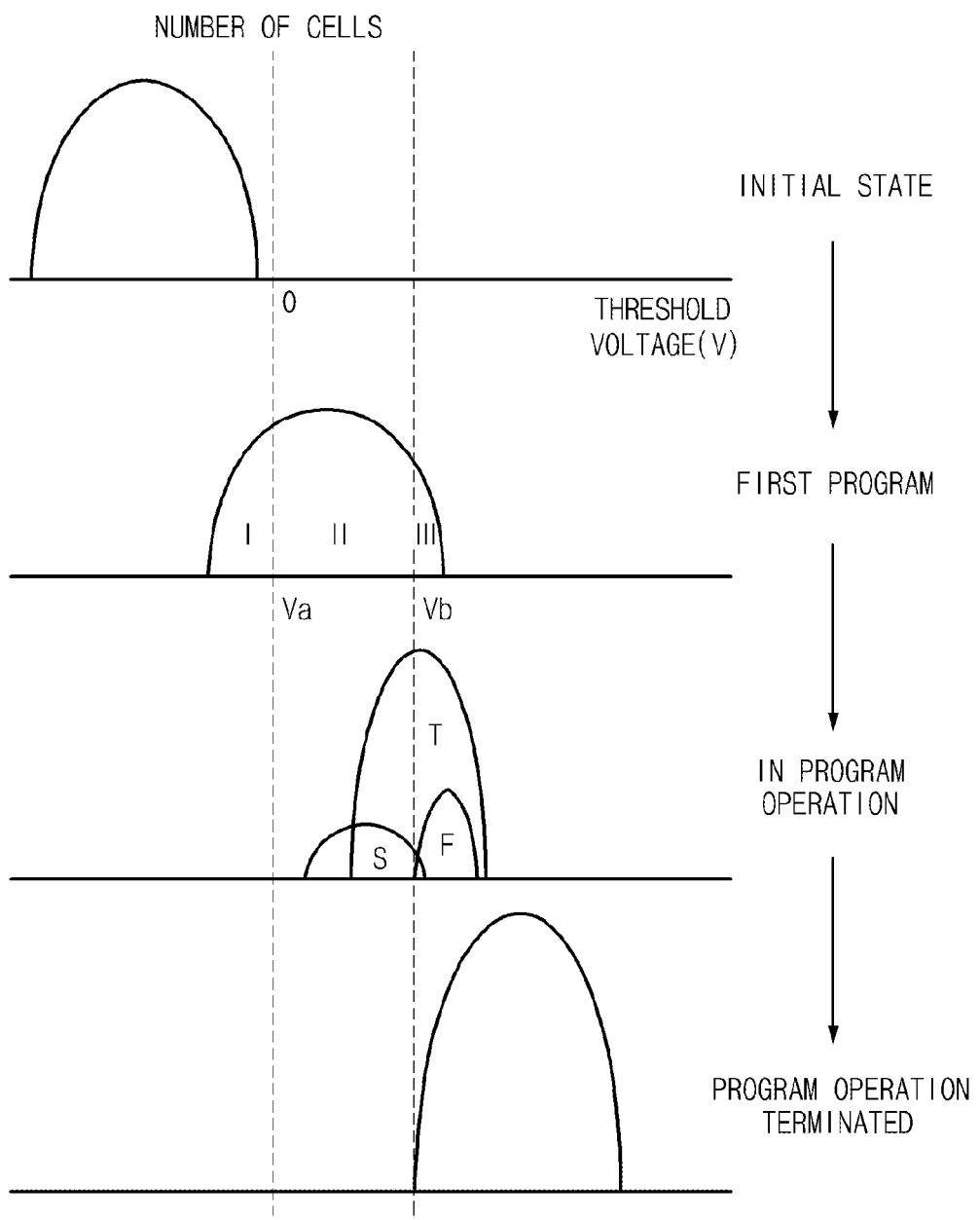
FIG. 8 illustrates the threshold voltage distribution by phases in a method of programming a semiconductor memory device according to an embodiment of the present invention.

FIG. 8 illustrates the threshold voltage distribution by phases in a semiconductor memory device according to an embodiment of the present invention.

Referring to FIG. 8, memory cells that were in an erasure status at an initial stage are classified into first to third regions I, II and III based on first and second classifying verification voltages Va and Vb after the first program. The memory cells in the first to third regions I, II, and III are classified into the first to third status cells to have different distribution characteristics during the program operation.

For a program status, one word line program voltage is supplied through a word line, but in a first status cell F (fast cell), the bit line program voltage consistently maintains the first bit line program voltage Vb1, so that a range of a threshold voltage of the first status cell F is not greater than that of the other memory cells due to the application of a relatively small voltage difference after the first program. In comparison with this case, in a second status cell T (typical cell), while the word line program voltage is supplied thereto, the first bit line program voltage Vb1 and the second bit line program voltage Vb2 having a smaller voltage level than the first bit line program voltage Vb1 are sequentially applied thereto, so that a range of a threshold voltage of the second status cell T is greater than that of the first status cell F. In a third status cell S (slow cell), the first, second and third bit line program voltages Vb1, Vb2 and Vb3 having sequentially decreasing values are continuously provided while the word line program voltage is supplied to the third status cell S, so that the third status cell S may have the greatest range of a threshold voltage.

As described above, the method of programming a semiconductor memory device according to the embodiments of the present invention can improve the program accuracy of memory cells by adjusting word line and bit line program voltages depending on statuses of the memory cells.

In an embodiment, a method of programming a semiconductor memory device includes providing a memory cell in a memory cell array, the memory cell being coupled to a word line and a bit line. A set of word line program voltages is applied to the word line to program the memory cell. A set of bit line voltages is applied to the bit line to program the memory cell while the set of word line program voltages is being applied to the word line. The applied set of bit line voltages is selected from at least first, second, and third sets based on a program characteristic of the memory cell.

The above example embodiments of the present invention are illustrative and do not to limit the scope of the present invention. Various alternatives and equivalents are possible. Other additions, subtractions, or modifications are obvious in view of the present disclosure and are intended to fall within the scope of the appended claims.

What is claimed is:

1. A method of programming a semiconductor memory device, the method comprising:
    classifying memory cells to be programmed based on program characteristics of the memory cells, wherein the memory cells are coupled to a selected word line; and
    sequentially providing word line program voltages having increasing voltage levels and bit line program voltages having decreasing voltage levels to the classified memory cells in one program loop, wherein differently classified memory cells receive different bit line program voltages, respectively.

2. The method according to claim 1, wherein the classifying of the memory cells comprises:
    a first step of performing a first program on the memory cells based on an address signal to classify the memory cells, wherein the first program is performed on first to third status cells.

3. The method according to claim 2, wherein the sequentially providing of the word line program voltages and the bit line program voltages comprises:
    a second step of applying first to third word line program voltages whose voltage levels sequentially increase through the selected word line;

a third step of providing a first bit line program voltage to the first status cell while the first to third word line program voltages are applied;

a fourth step of providing the first bit line program voltage to the second status cell while the first word line program voltage is applied and a second bit line program voltage to the second status cell while the second and third word line program voltages are applied; and a fifth step of providing the first bit line program voltage to the third status cell while the first word line program voltage is applied, the second bit line program voltage to the third status cell while the second word line program voltage is applied, and a third bit line program voltage to the third status cell while the third word line program voltage is applied.

4. The method according to claim 2, wherein the first to third status cells respectively correspond to a fast cell, a typical cell, and a slow cell.

5. The method according to claim 2, wherein the classifying of the memory cells into the first to third status cells comprises:
applying a program word line voltage having a predetermined voltage level to the memory cells to be programmed to perform the first program; and
classifying the memory cells where the first program is performed into the first to third status cells based on first and second classifying verification voltages.

6. The method according to claim 3, wherein the second to fifth steps constitute the one program loop and the method further comprises:
performing a verification operation on the memory cells after the one program loop is completed based on first to third verification voltages to re-classify the first to third status cells.

7. The method according to claim 6, further comprising:
repeating the program loop as increasing voltage levels of the first to third word line program voltages until all of the memory cells are determined as passed memory cells on which a program is completed.

8. The method according to claim 7, wherein the first word line program voltage used in a current program loop has a greater voltage level than the third word line program voltage used in a previous program loop.

9. The method according to claim 6, further comprising:
providing a program inhibition voltage through a bit line to a memory cell determined as a passed memory cell by a verification result while a next program loop is performed.

10. The method according to claim 2, wherein the classifying of the memory cells into the first to third status cells comprises:
storing the address signal of the memory cells and the statuses of the cells.

11. The method according to claim 3, wherein voltage levels of the first to third bit line program voltages become smaller sequentially.

12. A semiconductor memory device, comprising:
a memory cell array including memory cells to be programmed, which are coupled to a selected word line;
a program control unit configured to classify statuses of the memory cells and generate a row voltage control signal and a column voltage control signal;
a voltage generator configured to generate word line program voltages and bit line program voltages;
a row decoder configured to provide the word line program voltages whose voltage levels sequentially increase in one program loop to the selected word line in response to the row voltage control signal; and
a column decoder configured to provide the bit line program voltages whose voltage levels are different depending on the statuses of the memory cells to bit lines coupled to the memory cells in response to the column voltage control signal, the bit line program voltages sequentially decreasing based on the statuses of the memory cells in the one program loop.

13. The semiconductor memory device according to claim 12, wherein the program control unit includes:
a verification circuit configured to verify a program result on the memory cells to generate a verification signal;
a program control circuit configured to classify the statuses of the memory cells based on the verification signal and generate the row voltage control signal and the column voltage control signal; and
a cell status storage circuit configured to store addresses of the memory cells and the classified statuses of the memory cells.

14. The semiconductor memory device according to claim 12, wherein the memory cells are classified into a fast cell, a typical cell, and a slow cell, and
wherein, while the word line program voltages are applied to the selected word line in response to the row voltage control signal, the column decoder provides, in response to the column voltage control signal, a first bit line program voltage to the fast cell, the first and second bit line program voltages to the typical cell, and the first to third bit line program voltages to the slow cell.

15. The semiconductor memory device according to claim 14, wherein the row decoder provides first to third word line program voltages which sequentially increase in each program loop in response to the row voltage control signal.

16. The semiconductor memory device according to claim 14, wherein the first bit line program voltage, the second bit line program voltage following the first bit line program voltage, and the third bit line program voltage following the second bit line program voltage have sequentially decreasing values.

17. A method of programming a semiconductor memory device, the method comprising:
providing a memory cell in a memory cell array, the memory cell being coupled to a word line and a bit line;
applying a set of word line program voltages to the word line to program the memory cell; and
applying a set of bit line voltages to the bit line to program the memory cell while the set of word line program voltages is being applied to the word line,
wherein the applied set of bit line voltages is selected from at least first, second, and third sets based on a program characteristic of the memory cell,
wherein the first set of bit line voltages includes first, second, and third voltages that are different from each other, the second set of bit line voltages includes only the first voltage and the second voltage, and the third set of the bit line voltages includes only the second voltage, and
wherein the first voltage has the highest potential of the three, the second voltage has an intermediate potential of the three, and the third voltage has the lowest potential of the three.

18. The method of claim 17, where the memory cell is part of a string of memory cells in the memory cell array, and
wherein the set of word line program voltages includes at least three voltage pulses that progressively increases.

19. The method of claim 17, wherein the set of program word line voltages includes at least three voltage pulses that progressively increase with time, and the set of bit line voltages includes at least three voltage pulses that progressively decrease with time.

\* \* \* \* \*